United States Patent
Dejima et al.

(10) Patent No.: US 11,394,177 B2
(45) Date of Patent: Jul. 19, 2022

(54) LIGHT SOURCE DEVICE

(71) Applicant: NICHIA CORPORATION, Anan (JP)

(72) Inventors: Norihiro Dejima, Yokohama (JP); Masaki Omori, Toshima-ku (JP)

(73) Assignee: NICHIA CORPORATION, Anan (JP)

( * ) Notice: Subject to any disclaimer, the term of this patent is extended or adjusted under 35 U.S.C. 154(b) by 240 days.

(21) Appl. No.: 16/895,565

(22) Filed: Jun. 8, 2020

(65) Prior Publication Data
US 2020/0388990 A1    Dec. 10, 2020

(30) Foreign Application Priority Data
Jun. 10, 2019 (JP) .............................. JP2019-107918

(51) Int. Cl.
*H01S 3/10* (2006.01)
*H01S 5/40* (2006.01)
*H01S 5/14* (2006.01)

(52) U.S. Cl.
CPC ............ *H01S 5/4012* (2013.01); *H01S 5/141* (2013.01); *H01S 5/4056* (2013.01); *H01S 5/4062* (2013.01); *H01S 5/4087* (2013.01)

(58) Field of Classification Search
CPC ...... H01S 5/4012; H01S 5/141; H01S 5/4056; H01S 5/4062; H01S 5/4087
See application file for complete search history.

(56) References Cited

U.S. PATENT DOCUMENTS

| | | | | |
|---|---|---|---|---|
| 6,192,062 B1 * | 2/2001 | Sanchez-Rubio | ..... | H01S 5/4062 372/98 |
| 8,179,594 B1 * | 5/2012 | Tidwell | ............. | H04B 10/2513 359/349 |
| 2014/0268352 A1 * | 9/2014 | Vethake | ............. | G02B 27/0977 359/618 |
| 2015/0253577 A1 * | 9/2015 | Liebowitz | .......... | G02B 27/1006 359/634 |
| 2015/0331245 A1 * | 11/2015 | Tayebati | ............ | G02B 27/4244 359/634 |
| 2016/0161752 A1 * | 6/2016 | Negoita | ................ | H01S 5/4087 359/569 |

(Continued)

FOREIGN PATENT DOCUMENTS

| | | |
|---|---|---|
| CN | 105428996 A | 3/2016 |
| GB | 2 556 197 A | 5/2018 |

*Primary Examiner* — Kinam Park
(74) *Attorney, Agent, or Firm* — Foley & Lardner LLP (57) ABSTRACT

A light source device includes a plurality of external-cavity laser modules configured to emit a plurality of laser beams of different peak wavelengths, the plurality of external-cavity laser modules including at least one first laser module and at least one second laser module; and a beam combiner configured to coaxially combine the plurality of laser beams to generate a wavelength-combined beam. Each of the plurality of external-cavity laser modules includes: a collimation laser light source having a Littrow configuration, and a diffraction grating configured to selectively reflect and transmit light of a predetermined wavelength. The plurality of external-cavity laser modules are arranged so that the plurality of laser beams are incident on a same region of the beam combiner at different angles. A first distance between the first laser module and the beam combiner is different from a second distance between the second laser module and the beam combiner.

10 Claims, 9 Drawing Sheets

(56) References Cited

U.S. PATENT DOCUMENTS

2017/0205632 A1* 7/2017 Zhou .................. G02B 23/00
2018/0095285 A1   4/2018 Dejima
2018/0175590 A1   6/2018 Yamamoto et al.

\* cited by examiner

LIGHT SOURCE DEVICE

CROSS REFERENCE TO RELATED APPLICATION

This application claims priority to Japanese Patent Application No. 2019-107918 filed on Jun. 10, 2019, the entire contents of which are hereby incorporated by reference.

BACKGROUND

The present disclosure relates to a light source device that performs wavelength beam combining.

High-power and high-radiance laser beams are used for performing processing such as cutting, punching, or marking for various kinds of materials, or welding a metal material. Some of the carbon dioxide gas laser devices and YAG solid laser devices that have been used for such laser processing are being replaced by fiber laser apparatuses, which have a high efficiency of energy conversion. Laser diodes (hereinafter referred to as LD) are used for pumping light sources of fiber lasers. According to an increase in output of LDs in the recent years, techniques using LDs for light sources of a laser beam that directly irradiates a material to process the material, instead of using LDs for pumping light sources, have been studied. Such techniques are referred to as "direct diode laser (DDL) technology."

U.S. Pat. No. 6,192,062 describes an example of a light source device configured to combine a plurality of laser beams of different wavelengths emitted from respective ones of a plurality of LDs to increase the optical output power. Coaxially combining a plurality of laser beams of respective wavelengths is referred to as "wavelength beam combining (WBC)" or "spectral beam combining (SBC)," and may be used in, for example, enhancing the optical output power and radiance of a DDL system or the like.

SUMMARY

There is a demand for further enhancement of the optical output power and power density of laser beams that are combined using wavelength beam combining.

In one embodiment, a light source device according to the present disclosure includes: a plurality of external-cavity laser modules configured to emit a plurality of laser beams of different peak wavelengths, the plurality of external-cavity laser modules including at least one first laser module and at least one second laser module; and a beam combiner configured to coaxially combine the plurality of laser beams to generate a wavelength-combined beam. Each of the plurality of external-cavity laser modules includes: a collimation laser light source having a Littrow configuration, and a diffraction grating configured to selectively reflect and transmit light of a predetermined wavelength. The plurality of external-cavity laser modules are arranged so that the plurality of laser beams are incident on a same region of the beam combiner at different angles. A first distance between the first laser module and the beam combiner is different from a second distance between the second laser module and the beam combiner.

According to certain embodiments of the present disclosure, a light source device that is able to enhance the optical output power and power density of laser beams that are combined through wavelength beam combining can be provided.

DETAILED DESCRIPTION

Before describing embodiments of the present disclosure, findings that were made by the inventors and the technological background thereof will be described.

Figure 1:
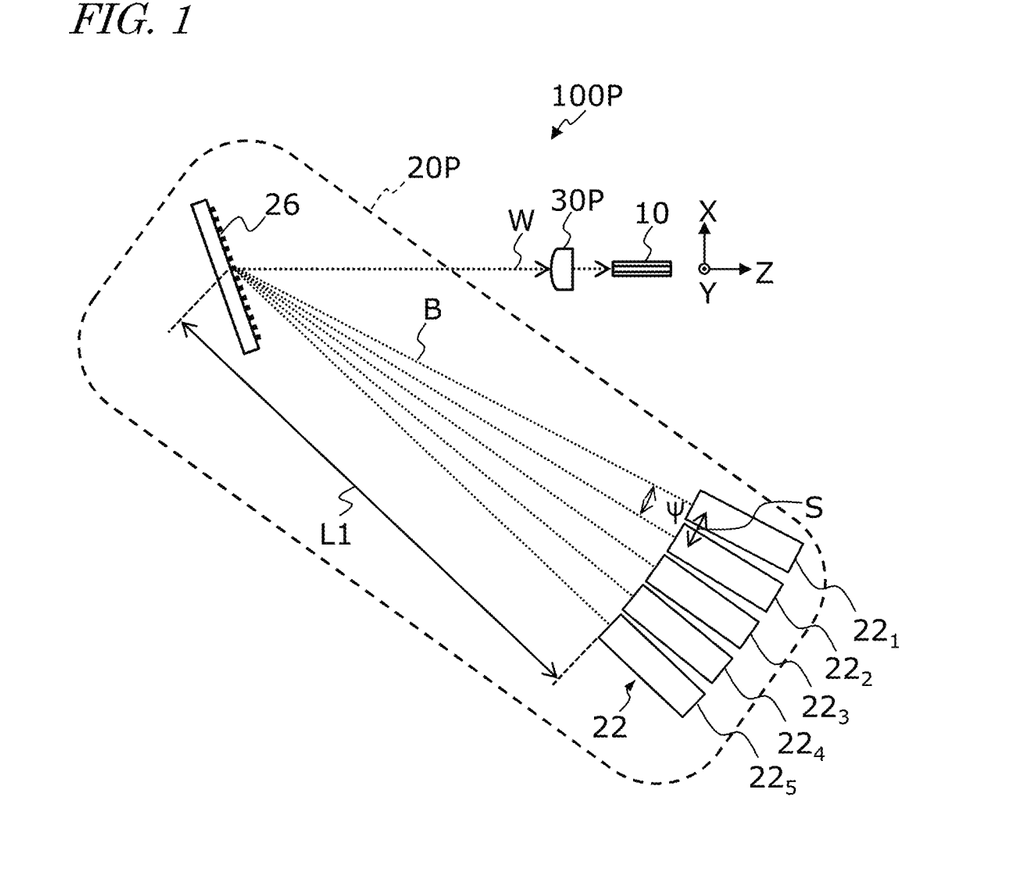
FIG. 1 is a diagram schematically showing an example of the structure of a light source device 100P in which laser beams that have been combined using wavelength beam combining are focused onto an optical fiber 10.

An example of a basic structure of a light source device configured to perform "wavelength beam combining (WBC)" will be described below. FIG. 1 is a diagram showing an example of a structure of a light source device in which laser beams that have been combined using WBC onto an optical fiber are focused. For reference, an XYZ coordinate system having an X axis, a Y axis, and a Z axis, which are orthogonal to one another, is schematically shown in the drawings including FIG. 1.

The light source device 100P shown in FIG. 1 includes an optical fiber 10, a beam light source 20P, and an optical coupling device 30P. The beam light source 20P coaxially combines a plurality of laser beams B of different peak wavelengths λ to generate and emit a wavelength-combined beam W. In the present disclosure, the term "wavelength-combined beam" refers to a laser beam in which a plurality of laser beams B of different peak wavelengths λ are coaxially combined using WBC. With the WBC technique, n laser beams of different peak wavelengths λ are coaxially combined, so that not only the optical output power but also the power density (unit: $W/cm^2$) can be increased to about n times the power density of each individual laser beam B.

In the example shown in FIG. 1, the beam light source 20P includes a plurality of laser modules 22 configured to emit a plurality of laser beams B of different peak wavelengths λ, and a beam combiner 26 configured to combine the plurality of laser beams B to generate a wavelength-combined beam W. FIG. 1 illustrates five laser modules $22_1$ through $22_5$.

In the example shown in FIG. 1, the beam combiner 26 is a reflection-type diffraction grating. Components other than a diffraction grating may be employed for the beam combiner 26, and another wavelength-dispersion optical element such as a prism may be employed for the beam combiner 26. The laser beams B are incident on the reflection-type diffraction grating at different angles, and all of minus-first order reflection-diffracted light of the laser beams B are emitted in the same direction. In FIG. 1, for simplicity, the center axis of each laser beam B and the center axis of the wavelength-combined beam W are illustrated to indicate each laser beam B and the wavelength-combined beam W. The wavelength-combined beam W emitted from the beam light source 20P is focused by the optical coupling device 30P, and is incident on the core of the optical fiber 10.

In the example of FIG. 1, the Y axis is parallel with the viewing direction of FIG. 1, and FIG. 1 schematically shows a view parallel to the XZ plane of the light source device 100P. The propagation direction of the wavelength-combined beam W is parallel to the Z axis direction.

As used herein, the distance from each laser module 22 to the reflection-type diffraction grating (beam combiner 26) is indicated by L1, and the angle between two adjacent laser modules 22, i.e., the angle between two adjacent laser beams B, is indicated by Ψ (radian: rad). In the example shown in FIG. 1, the distance L1 and the angle Ψ are uniform among the laser modules $22_1$ through $22_5$. Assuming that the arrangement interval (intervals between emitters) of the laser modules 22 is S, an approximate expression Ψ×L1=S holds true.

Figure 2:
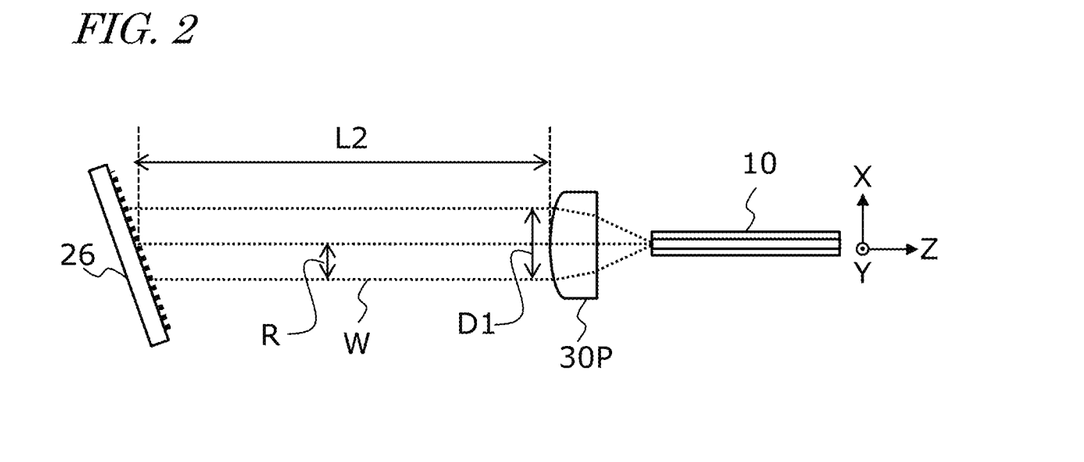
FIG. 2 is a diagram schematically showing focusing of a wavelength-combined beam W onto an optical fiber 10 by an optical coupling device 30P.

FIG. 2 is a diagram schematically showing a wavelength-combined beam W emitted from the beam combiner 26 and focused by the optical coupling device 30P onto the core of the optical fiber 10. One example of the optical coupling device 30P is a converging lens. For simplicity, the wavelength-combined beam W is schematically represented by three rays. Among the three rays, the middle ray is on the optical axis of the lens, while the other two rays schematically represent positions that would together define the beam diameter. The beam diameter can be defined by the size of a region having an optical intensity of, e.g., $1/e^2$ or more relative to the optical intensity in the beam center. Herein, "e" is Napier's constant (about 2.71). The beam diameter and the beam radius may alternatively be defined according to other criteria.

In FIG. 2, the wavelength-combined beam W is illustrated as a parallel collimated beam, and a diameter (incident beam diameter) of the wavelength-combined beam W along the X axis direction in a region incident on the optical coupling device 30P is denoted as D1. In actuality, however, the wavelength-combined beam W propagating along the Z axis direction is not perfectly parallel light. The beam radius R of the wavelength-combined beam W is not uniform, but rather is a function of position on the optical path (i.e., the coordinate value z on the Z axis) or optical path length. Moreover, the size of the beam radius R of the wavelength-combined beam W may be varied in the Y axis direction and the X axis direction. Therefore, in a strict sense, it would be appropriate to denote a beam radius of the wavelength-combined beam W along the Y axis direction as $R_Y(z)$ and a beam radius of the wavelength-combined beam W along the X axis direction as $R_X(z)$. Because the wavelength-combined beam W results from coaxial and spatial overlapping of the individual laser beams B, the beam radius R and the divergence half angle θ of the wavelength-combined beam W can be approximated as the beam radius w and the divergence half angle θ, respectively, of the individual laser beam B emitted from each laser module 22.

In FIG. 2, the distance between the reflection-type diffraction grating (beam combiner 26) and the optical coupling device 30P is denoted as L2. The distance L2 may be in a range of 100 to 500 mm, for example. Moreover, the distance L1 shown in FIG. 1 is, e.g., about 2000 mm or more. The angle Ψ and pitch S that define the distance L1 are restricted by the wavelength of the laser beam B, the structure and performance of the beam combiner 26, structure and size of each laser module 22, etc., and thus are difficult to be substantially reduced. Hereinafter, L1+L2 may be referred to as the "optical path length."

In order to enhance the optical output power and power density of the wavelength-combined beam W, it would be effective to increase the number of laser beams B to be combined into a single wavelength-combined beam W. However, when increasing the number of laser modules 22 in a configuration in which the arrangement pitch S of the laser modules 22 cannot be reduced, as shown in FIG. 1, the range of incident angles of the laser beams B that are incident on the beam combiner 26 is increased, or alternatively the distance L1 is increased. This will be described below.

Figure 3:
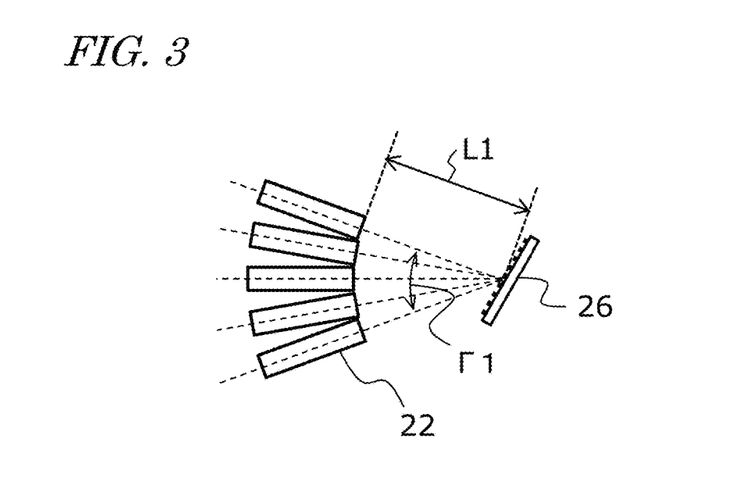
FIG. 3 is a diagram schematically showing an example where five laser modules 22 are densely arranged.

FIG. 3 is a diagram schematically showing an example of a structure in which five laser modules 22 are densely arranged. Each laser module 22 shown in FIG. 3 is spaced by the distance L1 from the same region of the beam combiner 26. In this example, the five laser beams B to be incident on the beam combiner 26 are within an angle Γ1. The relationship Γ1=4×Ψ holds true between the angle Ψ and the angle Γ1 shown in FIG. 1.

Figure 4A:
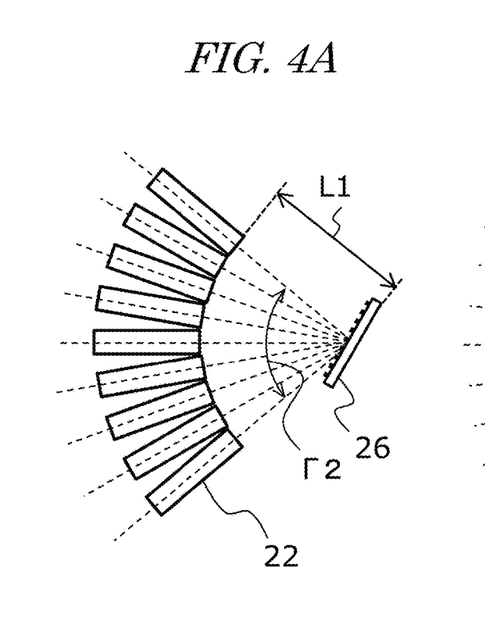
FIG. 4A is a diagram schematically showing an example where nine laser modules 22 are arranged without changing a distance L1.
Figure 4B:
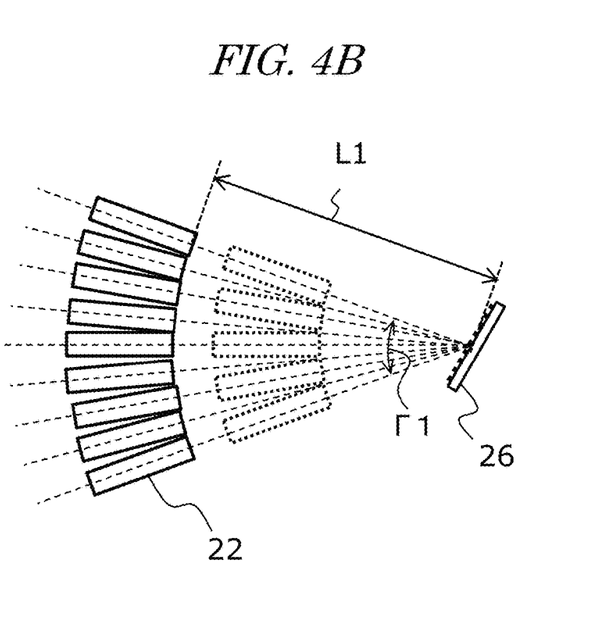
FIG. 4B is a diagram schematically showing an example where nine laser modules 22 are arranged, with an increased distance L1.

FIG. 4A shows an example in which the number of laser modules 22 in the arrangement is increased from five to nine while the distance L1 is not changed from that in the example shown in FIG. 3. In this example, the nine laser beams B that are incident on the beam combiner 26 are within an angle Γ2, such that Γ2=2×Γ1. On the other hand, FIG. 4B shows an example in which nine laser modules 22 are arranged with an increase in the distance L1. In this example, the nine laser beams B that are incident on the beam combiner 26 are within an angle Γ1. According to the arrangement of FIG. 4B, the angle Ψ between two adjacent laser beams B is reduced by half.

In the example of FIG. 4A, the angle Γ2 is increased to twice the angle Γ1, which requires increase in the range of wavelengths that encompasses the wavelengths of the nine laser beams B incident on the beam combiner 26. In other words, the wavelength range in which each individual laser module 22 can lase needs to be appropriately expanded so that the individual laser modules 22 can lase in a single longitudinal mode with different wavelengths. However, the wavelength range within which lasing can occur is restricted by the gain spectral width of each semiconductor laser device, and the shorter the emission wavelength of the semiconductor laser device, the narrower the gain spectral width tends to be. For example, in a semiconductor laser device having a band gap with a peak wavelength of 410 nm, lasing can occur within a wavelength range of about 400 to 420 nm. In other words, the gain spectral width is about 20 nm. On the other hand, in order to employ the example arrangement shown in FIG. 4A, a gain spectral width of 40 nm will be required, for example, which is difficult to realize. Accordingly, as shown in FIG. 4B, the distance L1 needs to be increased without changing the angle Γ1. However, an increase of distance L1 may result in increase in the size of the device, and may also result in that even a slight deviation in the direction of the laser beam B causes in a great shift in the irradiated position on the beam combiner 26.

According to certain embodiments of the present disclosure, a novel structure that is different from the example structures described above is employed, which allows for effectively increasing the optical output power of the wavelength-combined beam W.

Figure 5:
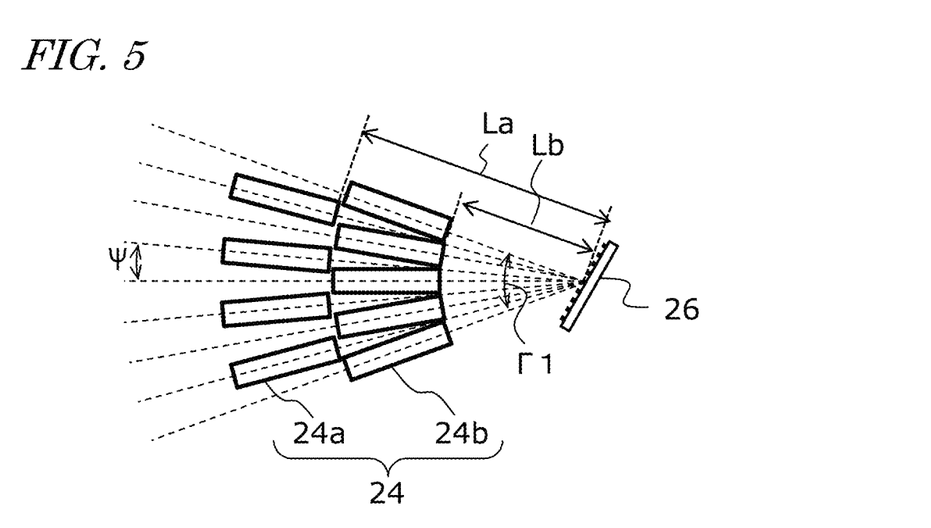
FIG. 5 is a diagram schematically showing an example of an arrangement of laser modules 24 included in a light source device according to the present disclosure.

With reference to FIG. 5, a basic structure of a light source device according to the present disclosure will bed. FIG. 5 is a diagram schematically showing an example of an arrangement of laser modules 24 included in the light source device. This light source device includes: a plurality of external-cavity laser modules 24 configured to emit a plurality of laser beams of different peak wavelengths; and a beam combiner 26 configured to coaxially combine the plurality of laser beams to generate a wavelength-combined beam. The plurality of laser modules 24 include at least one first laser module 24a and at least one second laser module 24b. As will be described below, each of the plurality of laser modules 24 includes a collimation laser light source having a Littrow configuration and a diffraction grating configured to selectively reflect and transmit light of a predetermined wavelength.

In the example of FIG. 5, a laser beam emitted from a laser light source (not shown) within each laser module 24 propagates along a broken straight line, and is incident on the beam combiner 26. The plurality of laser modules 24 are arranged so that the plurality of laser beams are incident on the same region of the beam combiner 26 at different angles. One characteristic of this example arrangement is that a distance La (first distance) between each first laser module 24a and the beam combiner 26 is different from a distance Lb (second distance) between each second laser module 24b and the beam combiner 26.

In this example, the plurality of laser modules 24 includes a plurality of second laser modules 24b, and the plurality of second laser modules 24b are arranged so that each laser beam emitted from the at least one first laser module 24a passes through a space (interspace) between corresponding two adjacent second laser modules 24b of the plurality of second laser modules 24b. The smallest interval between two adjacent second laser modules 24b is narrower than the width of a corresponding first laser module 24a at an emitting end of the corresponding first laser module 24a. The second laser modules 24b are arranged densely to the extent that a laser beam can travel between corresponding two adjacent second laser modules 24b. In the example shown in FIG. 5, the plurality of first laser modules 24a are arranged such that one end of each of the first laser modules 24a is located on the circumference of a circle whose radius is equal to the distance La, whereas the plurality of second laser modules 24b are arranged such that one end of each of the second laser modules 24b is located on the circumference of a circle whose radius is equal to the distance Lb.

With such a structure, the angle Ψ between two adjacent laser beams can be reduced by half, and also an increase in the distance La can be reduced. More specifically, the distance La can be shorter than the distance L1 shown in FIG. 4B. Accordingly, laser modules 24 can be arranged with a higher density without increasing the size of the light source device, so that high-power wavelength beam combining can be performed.

EMBODIMENT

Light Source Device

Figure 6:
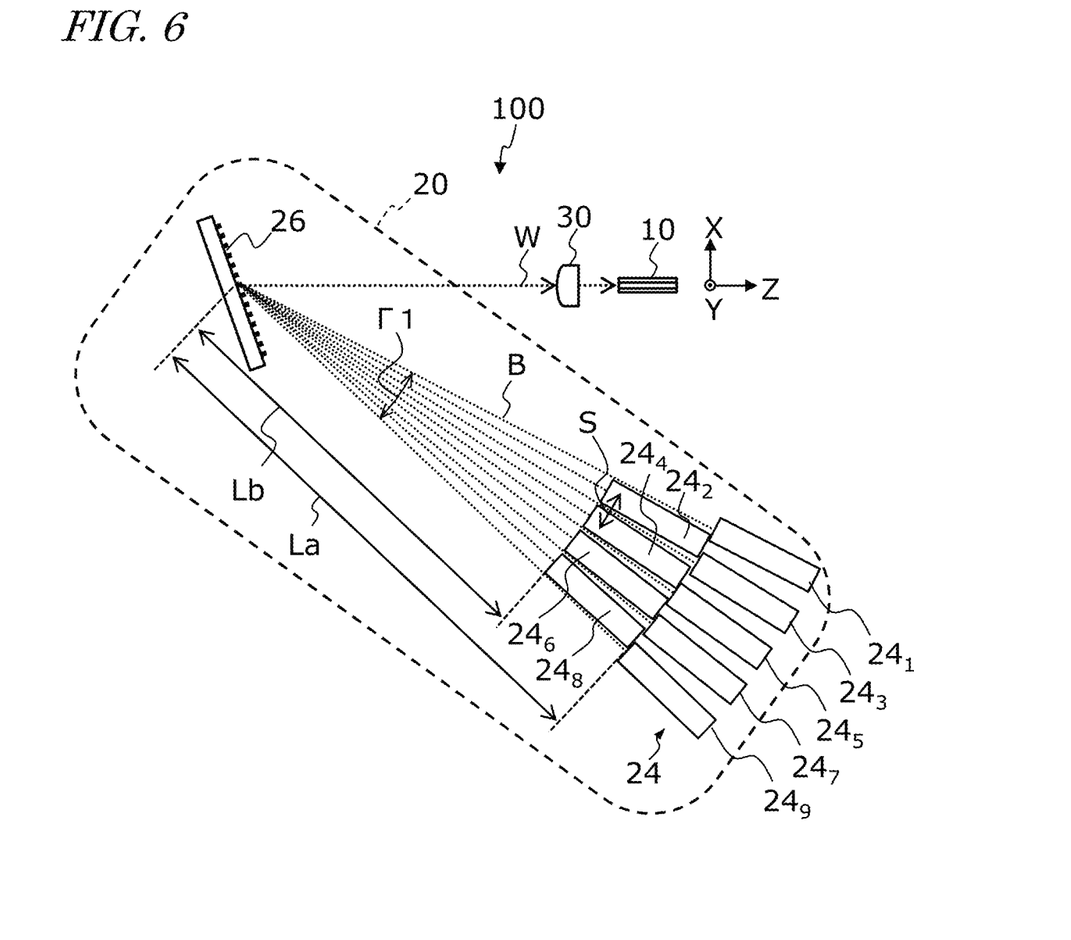
FIG. 6 is a diagram schematically showing an example of the structure of a light source device 100 according to one embodiment of the present disclosure.

FIG. 6 is a diagram showing an example of the structure of a light source device 100 according to one embodiment of the present disclosure. The light source device 100 shown in FIG. 6 includes an optical fiber 10, a beam light source 20, and an optical coupling device 30. The beam light source 20 includes: a plurality of external-cavity laser modules 24 configured to emit a plurality of laser beams B of different peak wavelengths; and a beam combiner 26 to coaxially combine the plurality of laser beams B to generate a wavelength-combined beam. Hereinafter, an example of the structure of the beam light source 20 will be described in detail.

An example of the structure of the optical coupling device 30 will be described below.

FIG. 6 shows nine laser modules $24_1$ to $24_9$. The laser modules $24_1$ to $24_9$ emit laser beams B of peak wavelengths $\lambda_1$ to $\lambda_9$, respectively. Herein, the relationship $\lambda_1 < \lambda_2 < \lambda_3 < \lambda_4 < \lambda_5 < \lambda_6 < \lambda_7 < \lambda_8 < \lambda_9$ holds true. The number of laser modules 24 that are included in the beam light source 20 may be other than nine; for example, ten or more laser modules 24 may be employed.

The beam light source 20 according to the present embodiment includes: the laser modules $24_1$, $24_3$, $24_5$, $24_7$ and $24_9$, which are spaced from the irradiated position of the beam combiner 26 by the distance La; and the laser modules $24_2$, $24_4$, $24_6$ and $24_8$, which are spaced from the irradiated position of the beam combiner 26 by the distance Lb (where Lb<La). In other words, the plurality of laser modules 24 are arranged so as to form multiple concentric circles with different radii from a common center that is located at the irradiated position of the beam combiner 26.

The laser beams B that are emitted from the laser modules $24_1$, $24_3$, $24_5$, $24_7$ and $24_9$, which are relatively far from the beam combiner 26, can pass through the interspaces between the laser modules $24_2$, $24_4$, $24_6$ and $24_8$, which are relatively close to the beam combiner 26, and can be incident on the beam combiner 26.

In the present embodiment, the peak wavelengths of adjacent laser beams B differ by $\delta\lambda$ ($\lambda_{n+1} - \lambda_n = \delta\lambda$) and the angle Ψ between adjacent laser beams B is e.g., about 0.4 degrees, i.e. about 7 milliradians (mrad). The interval between the peak wavelengths of the plurality of laser beams B is about 5 nm or less, for example. The interval between the peak wavelengths also depends on the spectral bands (wavelength regions) of the peak wavelengths of the laser beams B, the size and number of laser modules 24, etc. For example, in the case in which the peak wavelengths are within the range of 400 nm to 420 nm and ten laser modules 24 are employed, the interval between the peak wavelengths may be 3 nm or less, for example. Moreover, the smallest arrangement pitch S between adjacent laser modules 24, which are located at an identical distance from the beam combiner 26, is about 10 millimeters (mm). When such examples of values are employed, from the approximate expression $\Psi \times L1 = S$, the distance L1 is determined to be about 1500 mm, with the example arrangement of, e.g., FIG. 1. According to the present embodiment, however, the distance La can be reduced to about 900 mm. In order to efficiently accommodate component elements in a limited space, one or more mirrors may be disposed between the beam combiner 26 and a corresponding one or more of the laser modules 24, and the propagation direction of each laser beam B may be rotated using the one or more mirrors.

Figure 7:
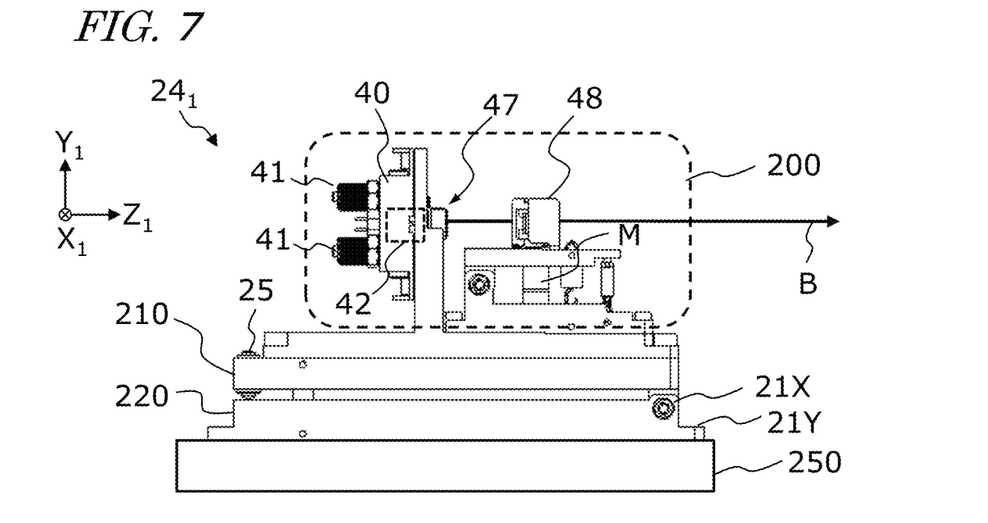
FIG. 7 is a side view schematically showing an example of a structure of an external-cavity laser module $24_1$.
Figure 8:
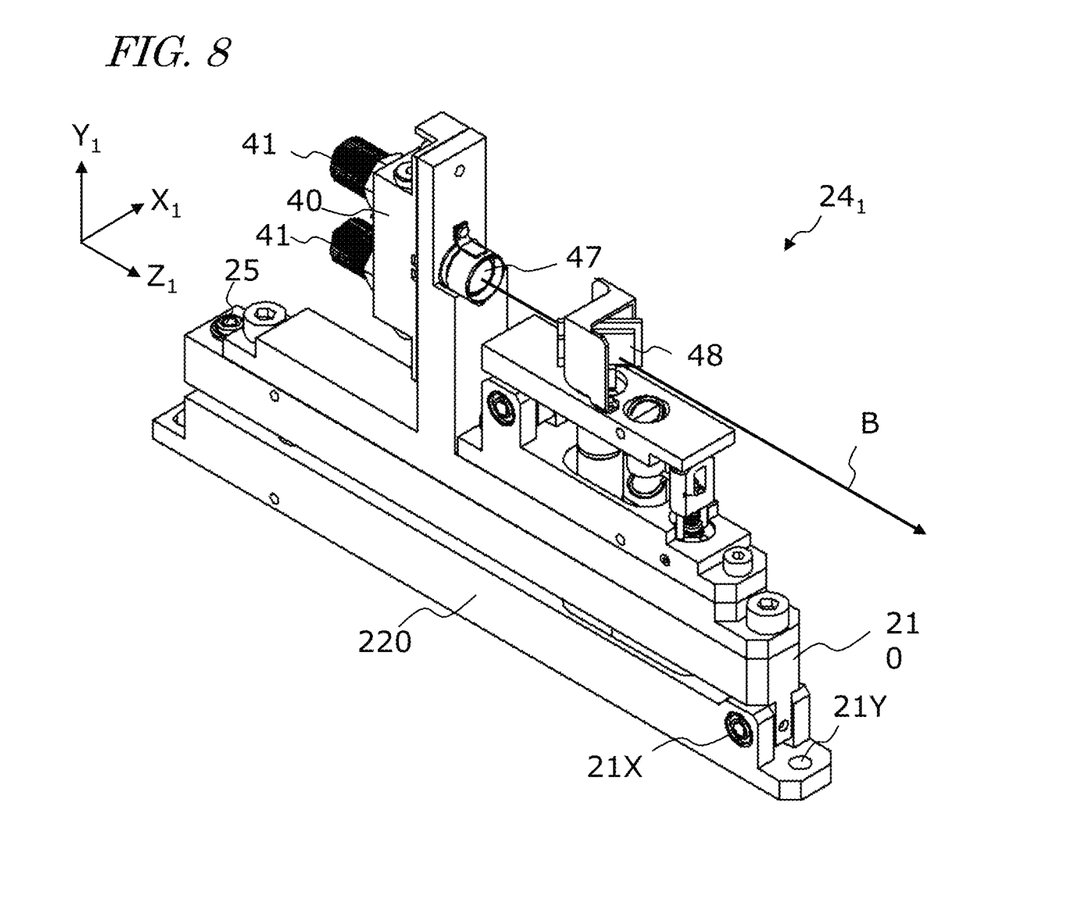
FIG. 8 is a perspective view schematically showing the example of a structure of the external-cavity laser module $24_1$.

Next, with reference to FIG. 7 and FIG. 8, a specific example of the structure of the external-cavity laser modules 24 will be described. FIG. 7 is a side view showing one example of the structure of the external-cavity laser module 24$_1$, and FIG. 8 is a perspective view thereof. The other external-cavity laser modules 24$_2$ to 24$_9$ have structures similar to that of the external-cavity laser module 24$_1$. For reference, an $X_1Y_1Z_1$ coordinate system having an $X_1$ axis, a $Y_1$ axis, and a $Z_1$ axis that are orthogonal to one another is schematically shown in FIG. 7 and FIG. 8. This $X_1Y_1Z_1$ coordinate system defines local coordinates for the laser module 24$_1$. Although it would be convenient if the origin of the $X_1Y_1Z_1$ coordinate system were illustrated at a position that coincides with the origin of the laser beam B in the laser module 24$_1$, the origin of the $X_1Y_1Z_1$ coordinate system is depicted at a location spaced apart from the origin of the laser beam B for ease of illustration. The $Z_1$ axis is parallel to the propagation direction (beam center axis) of the laser beam B.

In the example shown in FIG. 7 and FIG. 8, the laser module 24$_1$ includes: an external-cavity laser light source 200; a support member 210 supporting the laser light source 200; and a base 220 supporting the support member 210 rotatably around a horizontal axis parallel to the $X_1$ axis so as to allow correction of the axial direction of the laser beam B. The base 220 is supported by the pedestal 250 rotatably around a vertical axis parallel to the $Y_1$ axis. In the present specification, rotation around the vertical axis may be referred to as "θY rotation," while rotation around the horizontal axis may be referred to as "θX rotation." The pedestal 250 is made of a metal such as a stainless steel or aluminum, for example. The laser module 24$_1$ has a size along the $X_1$ axis direction smaller than its size along the $Y_1$ axis direction and smaller than its size along the $Z_1$ axis direction. If the size of the laser module 24$_1$ along the $X_1$ axis direction is excessively large, it may be difficult to arrange the plurality of laser modules 24 with a narrow angular pitch, as shown in FIG. 6. The size of the laser module 24$_1$ along the $X_1$ axis direction may be, for example, 12 mm or less.

In the example shown in FIG. 7 and FIG. 8, the laser module 24$_1$ has a shape and a size that can be accommodated in a rectangular-parallelepiped space having a size of, e.g., 12 mm or less along the $X_1$ axis direction. Therefore, a multitude of laser modules 24 can be arranged within a limited space without interfering one another. Moreover, the size of the rectangular-parallelepiped space along the $Z_1$ axis, which is defined by the support member 210 and the base 220, is larger than the size of the laser light source 200 along the $Z_1$ axis. The size (length) of the support member 210 along the $Z_1$ axis may be 80 mm or more.

The laser light source 200 includes a collimation laser light source 47 having a Littrow configuration and a diffraction grating 48 configured to selectively reflect and transmit light of a predetermined wavelength. The diffraction grating 48 functions as a wavelength selection element, and therefore may also be referred to as a "wavelength-selective diffraction grating." Hereinafter, an example of a basic structure of the laser light source 200 will be described.

Figure 9:
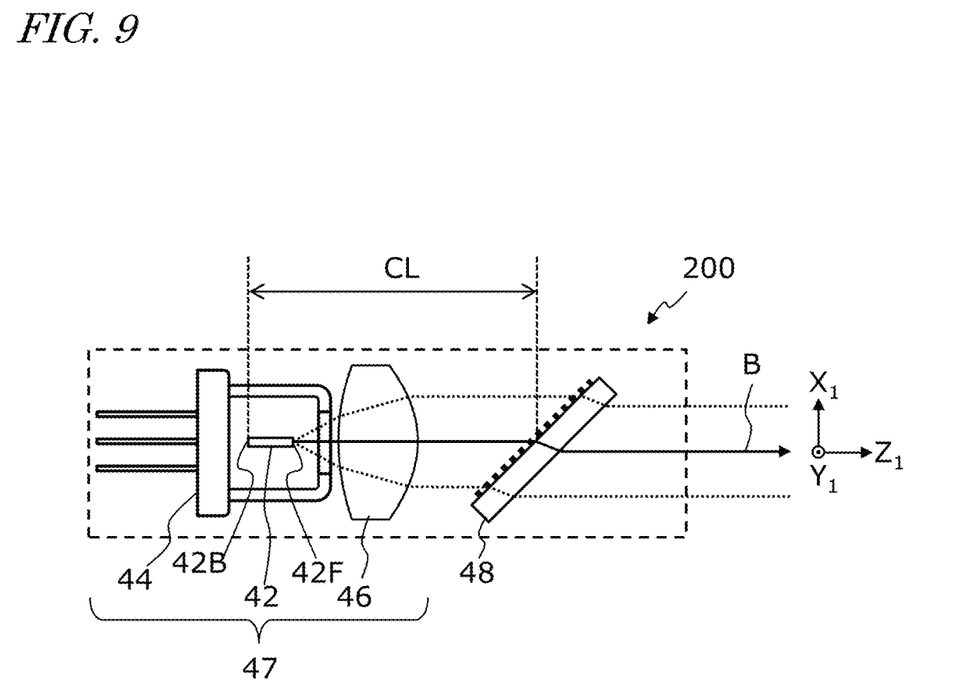
FIG. 9 is a cross-sectional view schematically showing an example of the structure of a laser light source 200 used in one embodiment.

A description with reference to FIG. 9 will be given below. FIG. 9 is a cross-sectional view showing a main structure of the laser light source 200. The laser light source 200 in FIG. 9 has an external-cavity structure that includes a laser diode 42 as a light source or an optical gain element (gain medium). Hereinafter, a laser diode will simply be referred to as an "LD." A system in which the lasing frequency of an LD is adjusted using such an external cavity is referred to as an "ECLD (External-Cavity Laser Diode)" or an "ECDL (External-Cavity Diode Laser)."

In one embodiment of the present disclosure, the LD 42 may be mounted in a semiconductor laser package (hereinafter simply referred to as a "package") 44 that is sealed airtight. The package 44 includes a stem having a lead terminal and a metal cap covering the LD 42 that has been fixed to the stem, with a light-transmitting window member being attached to the metal cap. Any appropriate structure may be employed for the package 44, and for example, the package 44 may be a TO-CAN type package of e.g., Φ5.6 mm or Φ9 mm. One example of the window member is a thin plate made of optical glass (refractive index: 1.4 or more). The inside of the package 44 can be filled with an inert gas, e.g., a nitrogen gas of high cleanliness or a noble gas, so that the package 44 can be sealed airtight. In general, if an LD 42 that emits a laser beam of a wavelength that is shorter than the near-infrared region are employed and their optical output power is increased, dust or the like in the ambient may adhere to the emitter region during operation due to optical dust attraction effect, which may reduce the optical output power. Other substance may also adhere to the emitter region, and a deposit generated by chemical reaction of volatilized organic matter with the laser beam may adhere to the emitter region. The shorter the wavelength of the laser beam is and the higher the optical output power is, the greater the deterioration associated with adhering substance is. In order to avoid such reduction in the optical output power, when accommodating the plurality of LDs 42 in a housing of the light source device 100, the housing may be assembled such that dust does not enter the housing, and then the housing may be sealed. However, there may be cases in which dust or the like adheres to the lens structure, diffraction gratings, or other parts that are necessary for wavelength beam combining, and also it is difficult to enhance airtightness of the entirety of the housing. In the present embodiment, each LD 42 is accommodated in a respective sealed semiconductor laser package. Technology for packaging LDs has been advanced, which allows highly reliable operation over long periods of time.

Examples of the LD 42 include a semiconductor laser element configured to emit near-ultraviolet, violet, blue, or green laser light and made of, for example, a nitride semiconductor-based material. The LD 42 may be secured to the stem via a submount having a high thermal conductivity.

The LD 42 may be oriented in a direction other than the example shown in the drawings, and the LD 42 may be oriented such that laser light therefrom is reflected along the Z axis direction by a mirror in the package 44.

Figure 10:
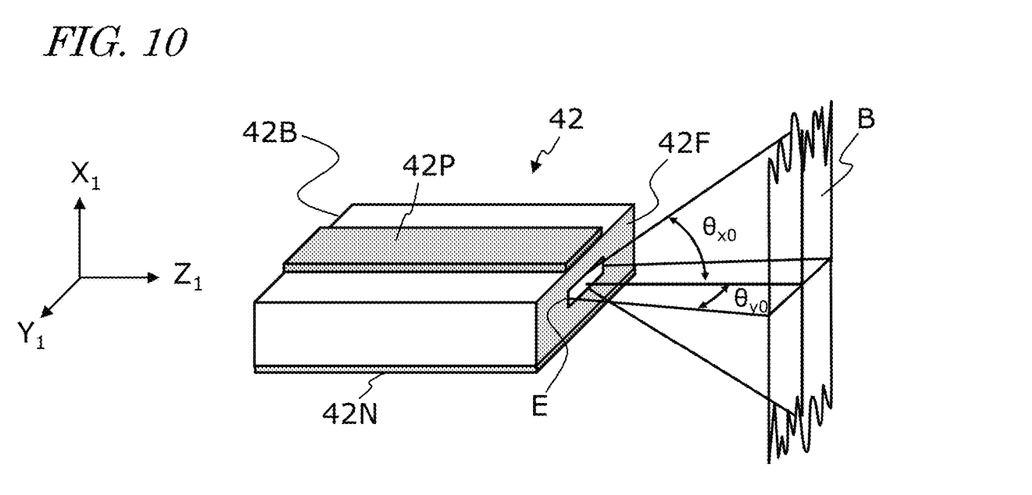
FIG. 10 is a perspective view schematically showing an example of a basic structure of an LD 42.

FIG. 10 is a perspective view schematically showing an example of a basic structure of the LD 42. The structure shown in FIG. 10 is simplified for description. In the example of FIG. 10, the LD 42 includes a stripe-shaped p-electrode 42P having a strip shape on an upper surface of the LD 42, an n-electrode 42N on a lower surface of the LD 42, and an emitter region E located on a first end surface 42F of the LD 42. The laser beam B is emitted from the emitter region E. The LD 42 includes a semiconductor substrate and a plurality of semiconductor layers (a semiconductor multilayer structure) that are grown on the semiconductor substrate. The semiconductor multilayer structure includes an emission layer, and may have various known structures. In this example, the emitter region E has a size along the $Y_1$ axis direction, that is, a $Y_1$-axis size, (e.g. about 15 μm) much larger than a size of the emitter region E along the $X_1$ axis direction, that is, an $X_1$-axis size (e.g. about 1.5 μm). The $X_1$-axis size of the emitter region E is defined by the semiconductor multilayer structure (more specifically, thicknesses of the waveguide and the cladding layers, refractive index ratio, etc.) of the LD 42. The $Y_1$-axis size of the emitter region E is defined by the $Y_1$-axis size of a region in which an electric current flows in a direction across the emission layer, more specifically, by the width (gain waveguide width) of a ridge structure (not shown) or the like.

The first end surface 42F of the LD 42 according to the present embodiment is provided with an antireflection coating. A second end surface 42B of the LD 42 is provided with a high-reflectance film. Accordingly, the region indicated by a distance CL in FIG. 9 forms a cavity, and the distance CL defines the cavity length. As will be described below, a portion of the laser beam B emitted from the LD 42 is diffracted by a transmission diffraction grating 48 and returns to the LD 42. A standing wave of a single longitudinal mode having a predetermined wavelength is generated between the high-reflectance film on the second end surface 42B of the LD 42 and the transmission diffraction grating 48. A portion of the cavity that is located outside the LD 42 is referred to as an "external cavity." The configuration shown in FIG. 9 is a Littrow configuration. A Littrow configuration does not need a mirror, which would be required in a Littman configuration, which is not shown. With a Littrow configuration having the transmission diffraction grating 48, the cavity length CL can be reduced, and it is easier to stabilize the resonance mode. In the present embodiment, the cavity length CL is in a range of 25 to 35 mm, for example.

As shown in FIG. 10, the beam shape in the $X_1$ axis direction of the laser beam B emitted from the emitter region E and the beam shape in the $Y_1$ axis direction of the laser beam B emitted from the emitter region E are asymmetric. A far field pattern of the laser beam B is schematically shown in FIG. 10. The laser beam B has a beam shape that approximates a single-mode Gaussian beam along the $X_1$ axis direction, and has a multi-mode beam shape with a small divergence angle as a whole along the $Y_1$ axis direction. The divergence half angle $\theta_{x0}$ along the $X_1$ axis direction is greater than the divergence half angle $\Gamma_{y0}$ along the $Y_1$ axis direction. In the $X_1$ axis direction, the laser beam B can be approximated as a Gaussian beam.

Therefore, given a beam radius $\omega_o$ at the beam waist along the $X_1$ axis direction and a wavelength λ of the laser beam B, then $\theta_{x0}=\tan^{-1}(\lambda/\pi\omega_o)\approx\lambda/(\pi\omega_o)$ radians holds true. In the case where λ is in the visible light region, $\theta_{x0}$ is, e.g., 20 degrees, and $\theta_{y0}$ is, e.g., 5 degrees. Accordingly, the $X_1$-axis size of the laser beam B increases, while relatively "rapidly" diverging, during propagation along the Z axis direction. Thus, the $X_1$ axis is called "the fast axis," and the $Y_1$ axis "the slow axis." The laser beam B has a multi-mode beam shape along the slow-axis direction, and thus the beam quality along the slow-axis direction is reduced relative to the beam quality along the fast-axis direction. Accordingly, the Beam Parameter Product (BPP) indicating beam quality is relatively larger along the slow-axis direction, relative to that along the fast-axis direction. BPP is a multiplication product between the beam waist radius and the divergence half angle in a far field.

As used in the present disclosure, the terms "fast axis direction" and "slow axis direction," when referring to each individual LD 42, respectively refer to a $Y_1$ axis and an $X_1$ axis in an $X_1Y_1Z_1$ coordinate system for each LD 42. When referring to the wavelength-combined beam W, the terms "fast axis direction" and "slow axis direction" respectively refer to "the X axis direction" and "the Y axis direction" in a global XYZ coordinate system. In other words, in a cross section that is orthogonal to the propagation direction of a laser beam, the direction along which BPP is the lowest is referred to as "the fast axis," and the direction that is orthogonal to the fast axis is referred to as "the slow axis".

Referring again to FIG. 9, the laser light source 200 includes a collimator lens 46 configured to collimate a laser beam B that is emitted from the LD 42. The collimator lens 46 is an aspherical lens, for example. The laser beam B that has been transmitted through the collimator lens 46 is in the form of a bundle of approximately parallel rays, and is incident on the transmission diffraction grating 48.

Figure 11A:
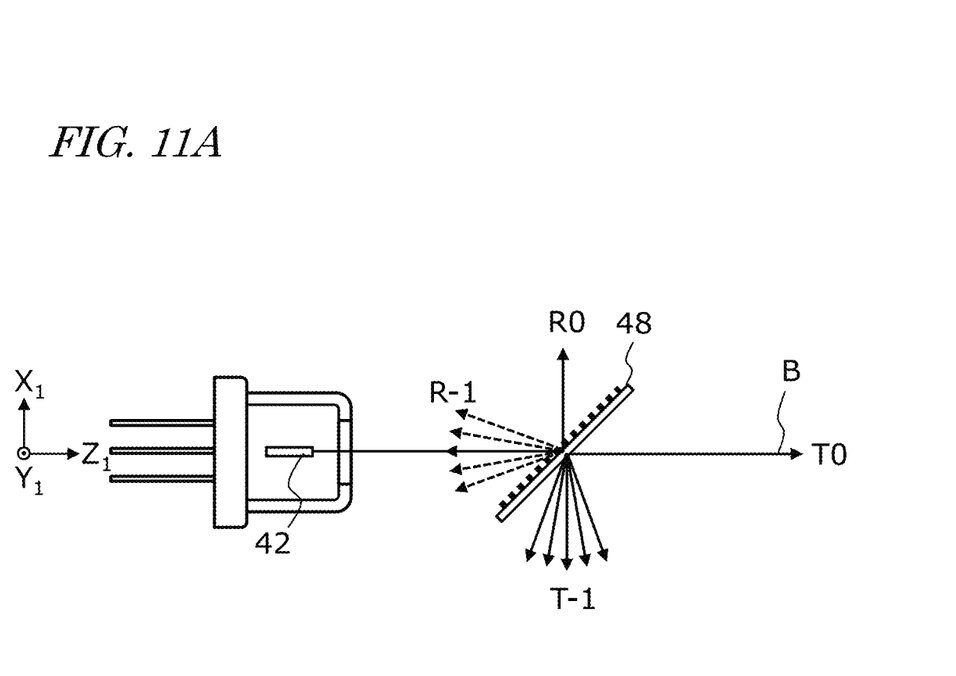
FIG. 11A is a cross-sectional view schematically showing an action of a transmission diffraction grating 48.
Figure 11B:
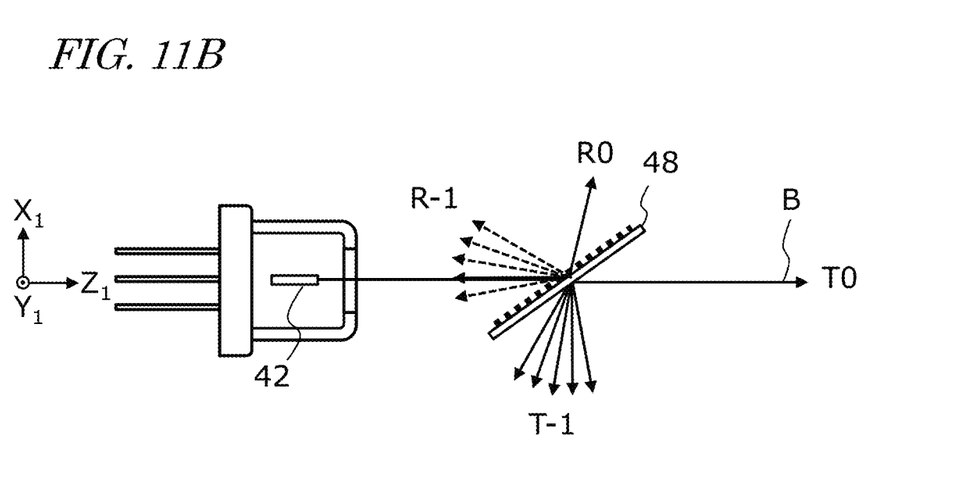
FIG. 11B is a cross-sectional view schematically showing an action of the transmission diffraction grating 48.

Each of FIG. 11A and FIG. 11B is a cross-sectional view schematically showing diffraction of the laser beam B by the transmission diffraction grating 48. A difference between FIG. 11A and FIG. 11B is the tilt angle of the transmission diffraction grating 48. In these figures, for simplicity, illustration of the collimator lens 46 is omitted, and the laser beam B and the diffracted light are also represented as straight lines.

The laser beam B is incident on the transmission diffraction grating 48 in the example in these drawings to obtain, mainly, $0^{th}$ order transmission-diffracted light T0, $0^{th}$ order reflection-diffracted light R0, minus-first order transmission-diffracted light T-1, and minus-first order reflection-diffracted light R-1. The minus-first order diffracted light T-1 and R-1 are emitted from the transmission diffraction grating 48 at different angles in accordance with their wavelengths. Of these diffracted light beams, the minus-first order reflection-diffracted light R-1 returns to the LD 42. When the Littman configuration described above is employed, the minus-first order reflection-diffracted light R-1 will be reflected by a mirror (not shown), and thereafter return to the LD 42 again through the transmission diffraction grating 48. Therefore, a Littman configuration may increase the cavity length, which may cause reduction in stability of the longitudinal mode.

In FIG. 11A and FIG. 11B, each of minus-first order diffracted light T-1 and R-1 is schematically indicated by five rays. These five rays are five imaginary minus-first order diffracted rays of mutually different wavelengths. In actuality, a single standing wave of the longitudinal mode will be formed within a cavity in which laser oscillation occurs, and only the diffracted ray(s) that has the wavelength of this standing wave will return to the LD 42 to contribute to laser oscillation. When the tilt angle of the transmission diffraction grating 48 changes, the wavelength of the minus-first order reflection-diffracted light R-1 to return to the LD 42 is shifted. Adjusting the tilt angle of the transmission diffraction grating 48 allows for selecting the wavelength of laser oscillation. Even when the tilt angle of the transmission diffraction grating 48 is constant, adjusting the grating pitch of the transmission diffraction grating 48 allows for obtaining similar effects.

In one example, the transmission diffraction grating 48 may be configured so that, with respect to a beam of a predetermined wavelength (e.g. about 410 nm) that is incident at a predetermined angle (40 to 50 degrees), a ratio of the $0^{th}$ order transmission-diffracted light T0 is, e.g., about 50% or more, a ratio of the minus-first order reflection-diffracted light R-1 is, e.g., about 15%, and a ratio of a total of the $0^{th}$ order reflection-diffracted light R0 and the minus-first order transmission-diffracted light T-1 is, e.g., about 10% or less.

As shown in FIG. 11A and FIG. 11B, the minus-first order reflection-diffracted light R-1 is oriented in different angles within the $X_1Z_1$ plane according to respective wavelengths. Therefore, the minus-first order reflection-diffracted light R-1 that are incident at different positions on an emission end surface of the laser diode 42 along the $X_1$ direction have respectively different wavelengths. As shown in FIG. 10, the emitter region E of the laser diode 42 has a relatively small size along the $X_1$ axis direction, as compared to a size of the emitter region E in the $Y_1$ axis direction. Therefore, the wavelength of the minus-first order reflection-diffracted light rays R-1 that is incident on the emitter region E has a very narrow width, so that the laser diode 42 can lase more stably in a single mode. If the laser diode 42 is rotated by 90° around the $Z_1$ axis so that the orientations of its fast axis and slow axis are reversed, the emitter region E will be disposed to be elongated along the $X_1$ axis. In that case, the minus-first order reflection-diffracted light R-1 incident on the emitter region E may have a broader range of wavelengths, and thus the laser diode 42 may be less likely to stably lase in a single mode.

Figure 12:
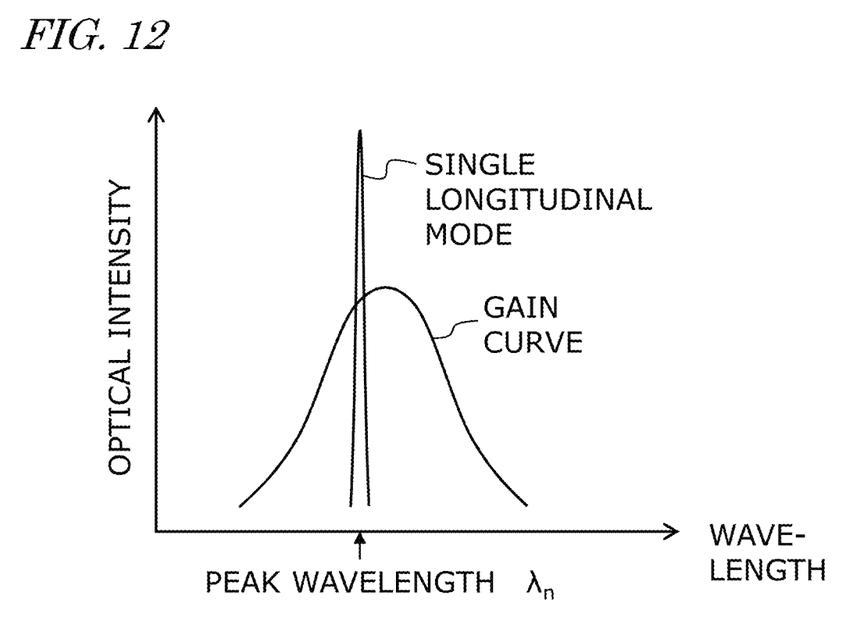
FIG. 12 is a diagram schematically showing a gain curve of the LD 42 and a spectrum of a laser beam B emitted from an external-cavity laser module 24 in which a single longitudinal mode lasing occurs at a certain wavelength $\lambda_n$.

FIG. 12 is a diagram schematically showing a gain curve (i.e., a curve representing wavelength dependence of gain) of the LD 42 and a spectrum of a laser beam B that is emitted from an external-cavity laser module 24 that is lasing in a single longitudinal mode at a certain wavelength $\lambda_n$. The wavelength (peak wavelength $\lambda_n$) of the laser beam B is selected from a wavelength range with a gain that allows laser oscillation. With the external-cavity structure, the laser beam B has a narrow spectral width, exhibiting a sharp peak.

According to one embodiment of the present disclosure, a plurality of LDs 42 configured to have gains that allow laser oscillation in a wavelength range that includes, e.g., a range of 400 to 420 nm. In other words, a plurality of LDs 42 having a gain spectral width of about 20 nm with the largest gain at a wavelength of 410 nm are provided. Then, the structure and tilt angle of the transmission diffraction grating 48 are adjusted so that the minus-first order reflection-diffracted light R-1 returning from the transmission diffraction grating 48 to the respective LDs 42 will have wavelengths different from each other by several nanometers. Using the external-cavity laser modules 24 allows the laser beams to have a narrow spectral width, and lasing wavelengths of the laser beams to be stable. Accordingly, using the beam combiner 26 such as a diffraction grating, a plurality of laser beams can be coaxially combined in a desired direction, with a high precision.

The plurality of laser beams B of different peak wavelengths $\lambda_n$ thus obtained are coaxially combined using wavelength beam combining to form the wavelength-combined beam W. LDs 42 of an identical gain spectral width (e.g. a wavelength range from 20 to 30 nm) generally have semiconductor multilayer structures that are made of a semiconductor of an identical composition. In embodiments of the present disclosure, other appropriate configurations may also be employed. For example, the LDs 42 may include a laser diode(s) including a light emission layer with a semiconductor composition different from that of other laser diode(s) of LDs 42, and accordingly with a gain spectrum that is not the same as that of other laser diode(s) of LDs 42. More specifically, for example, a plurality of laser beams B having peak wavelengths in at least one of the color ranges of ultraviolet, violet, blue, and green may be employed in any appropriate combination, so that a wavelength-combined beam W of various spectra can be formed.

Figure 13:
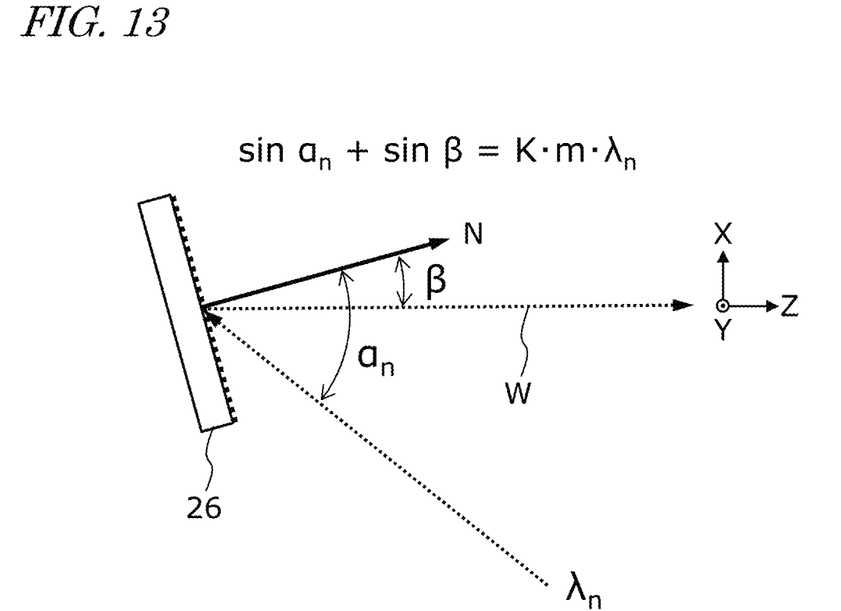
FIG. 13 is a diagram schematically showing the action of a reflection-type diffraction grating serving as a beam combiner 26 included in a beam light source 20 according to one embodiment.

FIG. 13 is a diagram showing the action of a reflection-type diffraction grating that is included in the beam light source 20 and serves as the beam combiner 26 according to the present embodiment. A laser beam B of a peak wavelength $\lambda_n$ is incident on the beam combiner 26 at an incident angle $\alpha_n$ relative to the normal direction N of the beam combiner 26. The minus-first order reflection-diffracted light is incident in the Z axis direction, at a diffraction angle β. In this case, the equation $\sin \alpha_n + \sin \beta = K \cdot m \cdot \lambda_n$ holds true, where K is the number of diffraction gratings per millimeter of the beam combiner 26, and m is the number of diffraction order.

In the present embodiment, laser beams B of peak wavelengths $\lambda_n$ that are different from each other are emitted from external-cavity laser modules 24, and are incident on the beam combiner 26 at appropriate incident angles $\alpha_n$. Accordingly, laser beams B that are diffracted by an identical diffraction angle β are spatially overlapped, so that wavelength beam combining is performed. If a directional offset among the laser beams B occurs as described with reference to FIG. 3 etc., the plurality of laser beams B may not be properly combined, thus resulting in a deteriorated beam quality. However, the present embodiment allows for correcting the directions of the laser beams B, and therefore deteriorations in the beam quality can be reduced.

FIG. 7 and FIG. 8 are referenced again.

In addition to the above-described component elements, the external-cavity laser light source 200 according to the present embodiment includes: a heat sink 40 onto which LDs 42 are secured, and a motor M configured to control the orientation of the transmission diffraction grating 48. The heat sink 40 is of a water cooling type. Water hoses not shown in the figure are connected to a channel within the heat sink 40 via a pair of couplers 41. The heat sink 40 may preferably be made of a metal material having high thermal conductivity, e.g., copper. The heat sink 40 has an opening through which the LDs 42 are received. Lead terminals of the LDs 42 protrude out of the heat sink 40, so as to be electrically connected to wiring cables not shown in the figure.

The heat sink 40 is secured to a pillar-like member that extends from the support member 210 in parallel to the $Y_1$ axis. The transmission diffraction grating 48 is supported by the support member 210 rotatably around an axis that is parallel to the $Y_1$ axis. Moreover, the motor M is also supported by the support member 210, such that a rotation shaft of the motor M is connected to a rotation shaft of the transmission diffraction grating 48. Deceleration gears may be disposed between the motor M and the transmission diffraction grating 48 to reduce the number of revolutions of the motor M. When electric power is supplied to the motor M from an external component (not shown in the figure), the motor M is able to rotate the transmission diffraction grating 48 by a desired angle. The angular resolution of rotation of the transmission diffraction grating 48 is higher than the angular resolution of θY rotation of the support member 210, and thus allows more precise angular adjustments. Angular adjustments by the transmission diffraction grating 48 allows for precisely controlling the resonant wavelength (lasing wavelength) of the external cavity.

Via the adjustment mechanism 21X, the support member 210 is rotatably supported by (i.e., connected to) the base 220. With a screw 25 or the like, the angle of the support member 210 may be fixed with respect to the base 220. The base 220 is rotatably supported by (i.e., connected to) the pedestal 250 via the adjustment mechanism 21Y. Adjustment of orientation or angle of the support member 210 with respect to the pedestal 250 using the adjustment mechanisms 21X and 21Y may be manually operated by an operator, or mechanically operated using an actuator such as a motor.

After the plurality of external-cavity laser modules 24 are arranged in the manner shown in FIG. 6, the angles of θY and θX rotation are adjusted using the adjustment mechanisms 21X and 21Y so that a laser beam B emitted from each laser module 24 is incident on the same region of the beam combiner 26. Thereafter, while measuring the BPP of the wavelength-combined beam W, the angle of the transmission diffraction grating 48 in each individual laser module 24 may be finely adjusted. Such adjustments allows for controlling the diffraction angle β of the laser beam B, so that the BPP of the wavelength-combined beam W can be further reduced.

Figure 14:
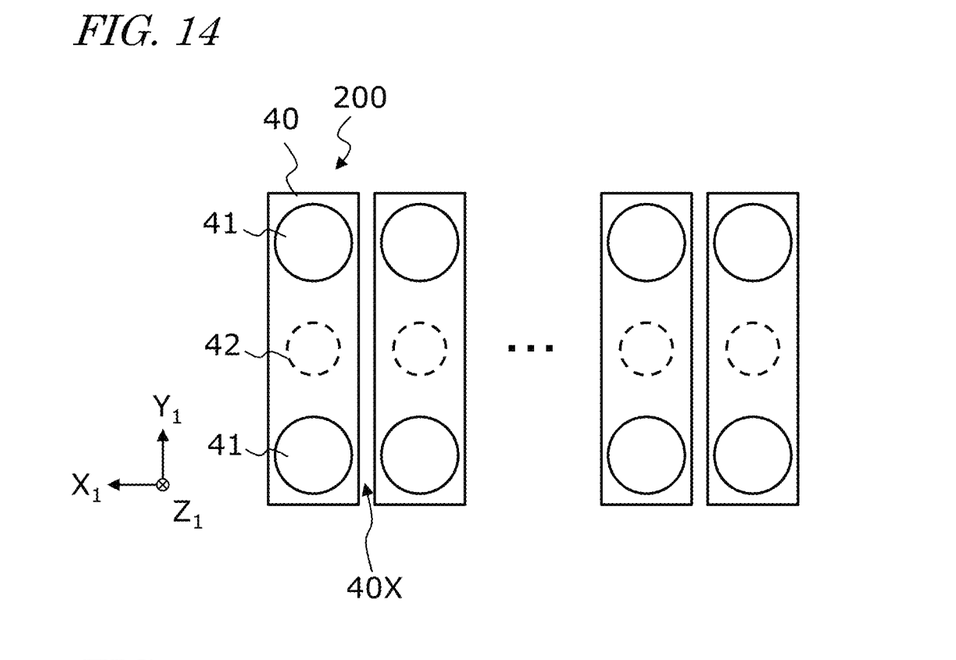
FIG. 14 is a diagram schematically showing an example of a planar arrangement for a plurality of laser light sources 200, when observed from the negative direction on the $Z_1$ axis.

Next, with reference to FIG. 14 and FIG. 15, examples of the outer shape of the laser light source 200 will be described. FIG. 14 is a diagram schematically showing a planar arrangement of a plurality of laser light sources 200 that are disposed at an equal distance from the beam combiner 26, when viewed from the negative direction on the $Z_1$ axis. In a strict sense, the plurality of laser light sources 200 are not parallel to one another, and the $X_1Y_1Z_1$ coordinate systems for respective laser modules are oriented in different directions. For ease of description, however, FIG. 14 shows the plurality of laser light sources 200 arranged in parallel to one another.

In the example shown in FIG. 14, each of the heat sinks 40 has flat lateral surfaces that extend parallelly to the $Y_1Z_1$ plane. In this case, the plurality of laser light sources 200 need to be disposed such that a gap 40X is formed between respective adjacent heat sinks 40. A gap 40X allows a laser beam emitted from a laser light source 200 disposed at a farther position from the beam combiner 26 passes through each gap 40X.

Figure 15:
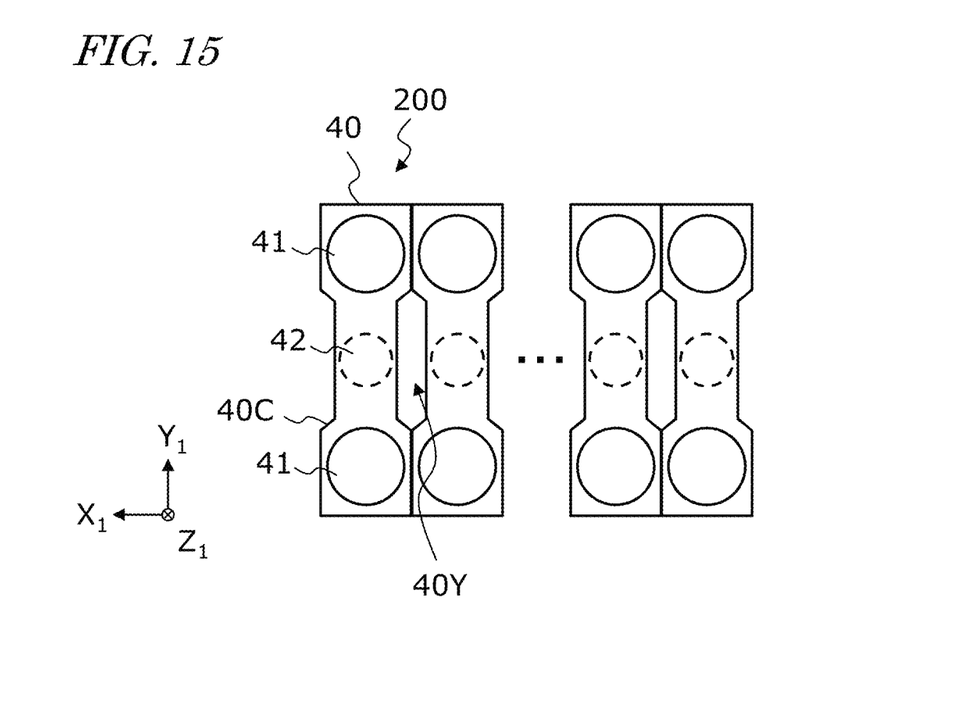
FIG. 15 is a diagram schematically showing another example of a planar arrangement for a plurality of laser light sources 200, when observed from the negative direction on the $Z_1$ axis.

FIG. 15 is a diagram schematically showing another example of a planar arrangement for a plurality of laser light sources 200 that are disposed at an equal distance from the beam combiner 26, when viewed from the negative direction on the $Z_1$ axis. In the example shown in FIG. 15, lateral surfaces of each heat sink 40 that are parallel to the $Y_1Z_1$ plane are not flat. Rather, each of these heat sinks 40 defines a recess 40C in two opposing sides parallel to the $Y_1Z_1$ plane. Therefore, even if the plurality of laser light sources 200 are disposed so that adjacent heat sinks 40 are in contact with each other, interspaces 40Y through which a laser beam can pass are formed between respective adjacent ones of the heat sinks 40. When accommodating a multitude of laser modules in a narrower space, it is preferable that each heat sink 40 and other element located on the laser light path define respective recesses through which a laser beam can pass, as shown in FIG. 15.

In one Example, eleven external-cavity laser modules 24 adapted to emit laser beams having peak wavelengths $\lambda_n$ as shown in Table 1 below were provided, and are aligned to have incident angles $\alpha_n$ and a diffraction angle β as shown in Table 1. More specifically, laser modules 24 whose module number n as indicated in Table 1 below is an odd number was disposed so as to be closer to the beam combiner 26 than was any laser module 24 whose module #n is an even number. In this Example, La was 900 mm, and Lb was 750 mm.

In the resultant light source device 100, eleven laser beams of different peak wavelengths, all emitted at the same diffraction angle β from the beam combiner (reflection-type diffraction grating) 26, were coaxially combined to generate a single wavelength-combined beam. In this example, K was 2222 mm$^{-1}$, and the maximum optical path length (Lb+L2) was about 1200 mm.

TABLE 1

| module number n | peak wavelength $\lambda_n$ (nm) | incident angle α | diffraction angle β |
| --- | --- | --- | --- |
| 1 | 399.13 | 42.90 | 11.90 |
| 2 | 401.53 | 43.32 | 11.90 |
| 3 | 403.93 | 43.74 | 11.90 |
| 4 | 406.30 | 44.16 | 11.90 |
| 5 | 408.66 | 44.58 | 11.90 |
| 6 | 411.00 | 45.00 | 11.90 |
| 7 | 413.32 | 45.42 | 11.90 |
| 8 | 415.63 | 45.84 | 11.90 |
| 9 | 417.92 | 46.26 | 11.90 |
| 10 | 420.19 | 46.68 | 11.90 |
| 11 | 422.45 | 47.10 | 11.90 |

In this Example, LDs 42 having gain at wavelengths in a range of about 399 to 422 nm are used. In other words, the gain spectral width Δλ is about 23 nm. As is clear from Table 1, there exists a wavelength difference δλ of about 2.3 nm between the peak wavelength $\lambda_n$ of a laser beam emitted from an n$^{th}$ laser module 24$_n$ and the peak wavelength $\lambda_{n+1}$ of a laser beam emitted from an n+1$^{th}$ laser module 24$_{n+1}$. Moreover, there exists a difference in angle of about 0.42 degrees between the incident angle $\alpha_n$ of a laser beam emitted from an n$^{th}$ laser module 24$_n$ and the incident angle $\alpha_{n+1}$ of a laser beam emitted from an n+1$^{th}$ laser module 24$_{n+1}$.

Any appropriate configurations other than those described in the example above may be employed in embodiments according to the present disclosure. For example, a plurality of LDs having a gain spectral width of, e.g., several tens of nanometers selected from within a wavelength range of, e.g., 350 to 550 nm may be used, which allows for performing wavelength beam combining in a various wavelength bands. In a wavelength range of 350 to 550 nm (and especially in the range of 400 nm to 470 nm), metals such as copper has a high absorptance, and accordingly, a wavelength-combined beam that is appropriate for metal machining can be obtained.

The wavelength-combined beam W emitted from the beam light source 20 having the structure described above has a beam quality asymmetric between the Y axis (slow axis) direction and the X axis (fast axis) direction. This will be described below.

Figure 16:
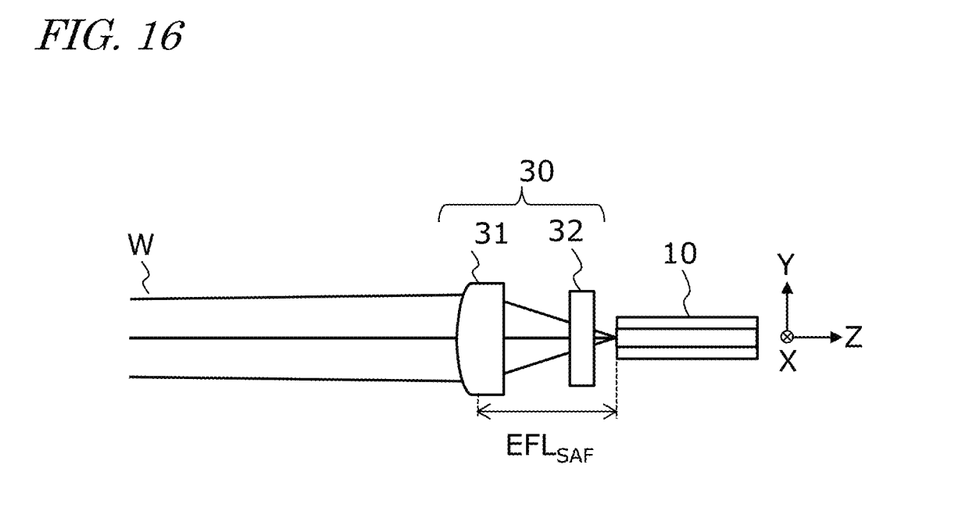
FIG. 16 is a cross-sectional view schematically showing an example of the structure of the optical coupling device 30 according to the present embodiment.

FIG. 16 is a diagram schematically showing an example of the structure of the optical coupling device 30. In this example, the optical coupling device 30 includes a first cylindrical lens (slow-axis converging lens) 31 configured to focus light in a first plane (YZ) and a second cylindrical lens (fast-axis converging lens) 32 configured to focus light in a second plane (XZ). The position of an image-side principal point of the first cylindrical lens 31 is distant from an incident end surface of the optical fiber 10 by the focal length (effective focal length) $EFL_{SAF}$ of the cylindrical lens 31. Therefore, with the action of the first cylindrical lens 31, the wavelength-combined beam W having been incident on the first cylindrical lens 31 is focused onto the incident end surface of the optical fiber 10.

In the present embodiment, the Y axis in FIG. 16 is parallel to the slow axis, and the X axis is parallel to the fast axis. While a laser beam that is emitted from the laser diode 42 propagates over a long distance (e.g. 400 mm or more), the shape of a cross section of the laser beam changes into an elliptic shape longer along the Y axis direction than along the X axis direction.

Direct Diode Laser System

Figure 17:
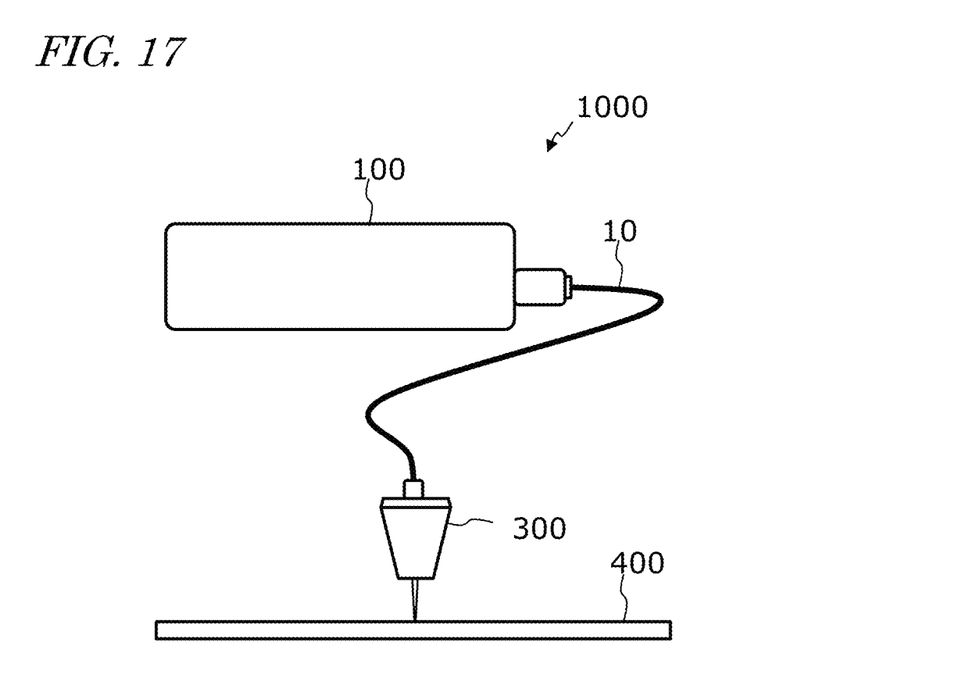
FIG. 17 is a diagram schematically showing an example of the structure of a DDL system 1000 according to one embodiment.

Next, with reference to FIG. 17, one embodiment of a direct diode laser (DDL) system according to the present disclosure will be described. FIG. 17 is a diagram showing an example of the structure of a DDL system 1000 according to the present embodiment.

The DDL system 1000 shown in FIG. 17 includes a light source device 100, and a processing head 300 connected to an optical fiber 10 that extends from the light source device 100. The processing head 300 irradiates a target object 400 with a wavelength-combined beam emitted from the optical fiber 10. In the example shown in FIG. 13, a single light source device 100 is employed.

The light source device 100 in this example has a structure similar to the structure of the light source device 100 described above. Any appropriate number of external-cavity laser modules may be mounted in the light source device 100, and the number of external-cavity laser modules mounted in the light source device 100 may be determined in accordance with the optical output power or irradiance that is needed. The wavelength of the laser light to be radiated from each external-cavity laser module may also be selected in accordance with the material to be processed. For example, when processing copper, brass, aluminum or the like, LDs having a central wavelength in the range of 350 nm to 550 nm may be preferably employed.

According to the present embodiment, a high-power laser beam is generated through wavelength beam combining, and is efficiency coupled onto an optical fiber, so that a high-power density laser beam having high beam quality can be obtained with a high efficiency of energy conversion.

A light source device according to the present disclosure can be used for a wide range of applications where high-power laser light with a high beam quality is needed to be radiated from an optical fiber. The light source device according to the present disclosure may be used in industrial fields where high-power laser light sources are needed, e.g., cutting or holing of various materials, local heat treatments, surface treatments, metal welding, 3D printing, and the like.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:

1. A light source device comprising:
a plurality of external-cavity laser modules configured to emit a plurality of laser beams of different peak wavelengths, the plurality of external-cavity laser modules comprising at least one first laser module and at least one second laser module; and
a beam combiner configured to coaxially combine the plurality of laser beams to generate a wavelength-combined beam, wherein:
each of the plurality of external-cavity laser modules comprises:
a collimation laser light source having a Littrow configuration, and
a diffraction grating configured to selectively reflect and transmit light of a predetermined wavelength,
the plurality of external-cavity laser modules are arranged so that the plurality of laser beams are incident on a same region of the beam combiner at different angles, and
a first distance between the at least one first laser module and the beam combiner is different from a second distance between the at least one second laser module and the beam combiner.

2. The light source device of claim 1, wherein:
the at least one second laser module comprises a plurality of second laser modules.

3. The light source device of claim 2, wherein:
the plurality of external cavity laser modules are arranged so that each laser beam emitted from the at least one first laser module passes through a space between corresponding two adjacent second laser modules of the plurality of second laser modules.

4. The light source device of claim 3, wherein:
a smallest interval between two adjacent second laser modules of the plurality of second laser modules is narrower than a width of a corresponding one of the at least one first laser module at an emitting end of the corresponding one of the at least one first laser module.

5. The light source device of claim 1, wherein:
the peak wavelengths of the plurality of laser beams are in a range of 350 nm to 550 nm.

6. The light source device of claim 1, wherein:
the collimation laser light source comprises:
a laser diode accommodated in a sealed semiconductor laser package, and
a lens configured to collimate laser light that is emitted from the laser diode.

7. The light source device of claim 6, wherein:
the peak wavelength of the plurality of laser beams are in a range of 400 nm to 470 nm.

8. The light source device of claim 1, wherein:
the plurality of external-cavity laser modules comprises nine or more external-cavity laser modules.

9. The light source device of claim 1, wherein:
the plurality of laser beams are incident on the same region of the beam combiner at angles with intervals of 1 degree or less.

10. The light source device of claim 9, wherein:
intervals between the peak wavelengths of the plurality of laser beams are 5 nm or less.

* * * * *